United States Patent
Chen et al.

(10) Patent No.: US 11,128,280 B2
(45) Date of Patent: Sep. 21, 2021

(54) FILTER AND OPERATION METHOD

(71) Applicant: Realtek Semiconductor Corporation, Hsinchu (TW)

(72) Inventors: Yun-Tse Chen, Hsinchu (TW); Kai-Yin Liu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/847,810

(22) Filed: Apr. 14, 2020

(65) Prior Publication Data
US 2021/0126626 A1   Apr. 29, 2021

(30) Foreign Application Priority Data

Oct. 24, 2019 (TW) ................................ 108138474

(51) Int. Cl.
*H03H 11/12* (2006.01)

(52) U.S. Cl.
CPC ....... *H03H 11/126* (2013.01); *H03H 11/1204* (2013.01)

(58) Field of Classification Search
CPC ............... H03H 11/04; H03H 11/0405; H03H 11/0422; H03H 11/12; H03H 11/1204; H03H 11/1213; H03H 11/126; H03H 11/1269; H03H 11/1273; H03H 11/1291; H03H 17/0283; H03H 17/0286; H03H 7/0153; H03H 7/0161; H03H 7/12; H03F 3/005; H03F 2203/45084; H03K 3/013; H03K 5/1252

See application file for complete search history.

(56) References Cited

U.S. PATENT DOCUMENTS

| | | | |
|---|---|---|---|
| 6,618,579 B1 | 9/2003 | Smith et al. | |
| 7,092,534 B2 * | 8/2006 | Wang | H03F 1/305 330/261 |
| 8,934,644 B2 * | 1/2015 | Takemura | H04R 3/14 381/99 |
| 9,210,749 B2 * | 12/2015 | Lopez | H05B 45/37 |
| 2007/0159183 A1 * | 7/2007 | Umemura | G01D 5/2417 324/661 |

* cited by examiner

*Primary Examiner* — Long Nguyen
(74) *Attorney, Agent, or Firm* — Locke Lord LLP; Tim Tingkang Xia, Esq.

(57) ABSTRACT

A filter can perform two filtering processes. The filter includes a switching circuit, a first filter circuit, and a second filter circuit. The first filter circuit is coupled to the switching circuit. The second filter circuit is coupled to the switching circuit. The first filter circuit performs a first filtering process on an input signal according to a state of the switching circuit. The first filter circuit and the second filter circuit work together to perform a second filtering process on the input signal according to the state of the switching circuit.

19 Claims, 8 Drawing Sheets

FILTER AND OPERATION METHOD

RELATED APPLICATIONS

This application claims priority to Taiwanese Application Serial Number 108138474, filed Oct. 24, 2019, which is herein incorporated by reference.

BACKGROUND

Technical Field

The present disclosure relates to a circuit technology. More particularly, the present disclosure relates to a filter and an operation method.

Description of Related Art

With development of technology, filters have been applied to various circuit systems. The filters are configured to filter out signals in unwanted frequency bands for subsequent signal processing. When circuit systems are applied to different applications, different filters are utilized to perform different filtering processes.

SUMMARY

One embodiment of the present disclosure is related to a filter. The filter includes a switching circuit, a first filter circuit, and a second filter circuit. The first filter circuit is coupled to the switching circuit. The second filter circuit is coupled to the switching circuit. The switching circuit is controlled to control the first filter circuit to perform a first filtering process on an input signal or control the first filter circuit to work in coordination with the second filter circuit to perform a second filtering process on the input signal.

One embodiment of the present disclosure is related to an operation method of a filter. The operation method includes: controlling a switch to be turned on or off; performing a first filtering process on an input signal by a first filter circuit when the switch is in a first state; and performing a second filtering process on the input signal by the first filter circuit and the second filter circuit when the switch is in a second state.

As shown in the above embodiments, the filter of the present disclosure can perform different filtering processes.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
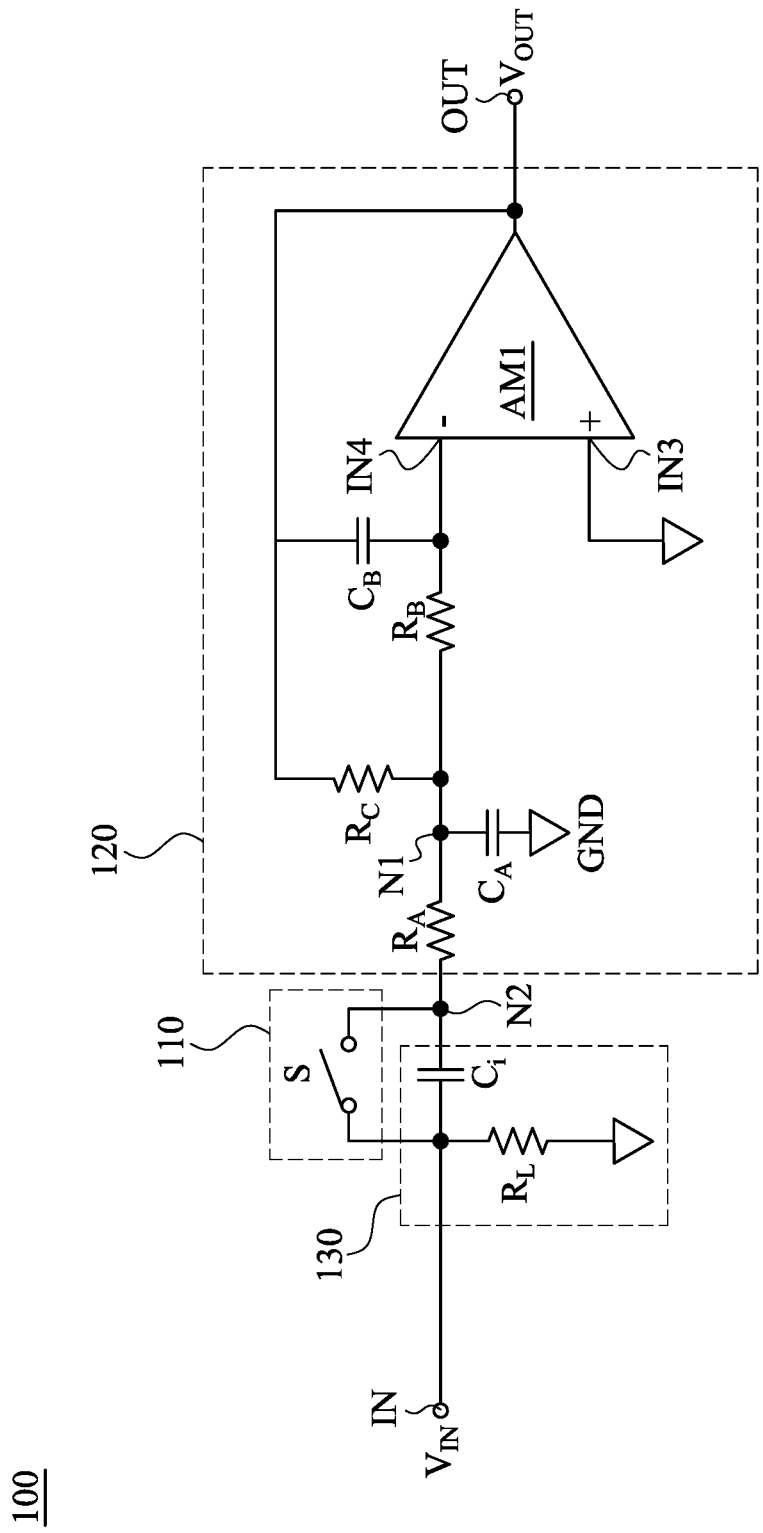
FIG. 1 is a circuit diagram illustrating a filter according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may be referred to "electrically connected" or "electrically coupled." "Connected" or "coupled" may also be referred to operations or actions between two or more elements.

Reference is made to FIG. 1. FIG. 1 is a circuit diagram illustrating a filter 100 according to some embodiments of the present disclosure. The filter 100 has an input terminal IN and an output terminal OUT. The input terminal IN is configured to receive an input signal $V_{IN}$. In this embodiment, the input signal $V_{IN}$ is a single-end signal. The filter 100 is configured to perform a filtering process on the input signal $V_{IN}$ to filter signals in unwanted frequency bands, such that an output signal $V_{OUT}$ is generated at the output terminal OUT.

In some embodiments, the filter 100 is applied to Ethernet chips, but the present disclosure is not limited thereto. Various applications are within scopes of the present disclosure.

As illustrated in FIG. 1, the filter 100 includes a switching circuit 110, a filter circuit 120, and a filter circuit 130. The switching circuit 110 is coupled to the filter circuit 120 and the filter circuit 130. The filter circuit 120 is a low pass filter circuit. The filter circuit 130 is a high pass filter circuit. The input terminal IN of the filter 100 is coupled to the output terminal OUT of the filter 100 sequentially through the filter circuit 130 and the filter circuit 120. Alternately stated, in FIG. 1, compared to the filter circuit 120, the filter circuit 130 (high pass filter circuit) is closer to the input terminal IN.

The switching circuit 110 includes a switch S. The switch S may be implemented by a transistor. The switch S is controlled to control the filter circuit 120 to perform a low pass filtering process on the input signal $V_{IN}$, or control the filter circuit 120 to work in coordination with the filter circuit 130 to perform a band pass filtering process on the input signal $V_{IN}$. Alternately stated, based on a state (for example, a turned-on state or a turned-off state) of the switch S, the filter 100 can perform different filtering processes.

For example, when the switch S is turned on, the input signal $V_{IN}$ is directly inputted to the filter circuit 120 via a path of the switch S. Since the filter circuit 120 is a low pass filter circuit, the filter circuit 120 performs a low pass filtering process on the input signal $V_{IN}$. When the switch S is turned off, the input signal $V_{IN}$ is inputted to the filter circuit 120 via the filter circuit 130. Since the filter circuit 130 is a high pass filter circuit and the filter circuit 120 is the low pass filter circuit, the filter circuit 130 and the filter circuit 120 sequentially perform a high pass filtering process and a low pass filtering process on the input signal $V_{IN}$. Effectively, the filter circuit 120 works in coordination with the filter circuit 130 to perform a band pass filtering process on the input signal $V_{IN}$.

As described above, the filter 100 can perform at least two filtering processes. Therefore, if the filter 100 is disposed in a circuitry, the circuitry can be applied to different applications (for example, a GIGA mode of Ethernet and a 2.5G mode of Ethernet).

In addition, if Ethernet is taken as an example, the input signal $V_{IN}$ is about 1.65 volt. When the switch S is turned off, since the filter circuit 130 (high pass filter circuit) is disposed to be closer to the input terminal IN, the filter circuit 130 (high pass filter circuit) can isolate the input signal $V_{IN}$ with a high voltage from the filter circuit 130. Thus, sizes of elements of the filter circuit 120 can be designed to be smaller and reliability of the circuitry can be increased. In some embodiments, in order to prevent the filter circuit 120 from directly suffering the input signal $V_{IN}$ with a high voltage, when the switch S is turned on, small currents at a node N1 or an input terminal IN4 of an amplifier AM1 can be extracted. Thus, the sizes of the elements of the filter circuit 120 can be designed to be smaller and reliability of the circuitry can be increased.

The filter circuit 120 includes the amplifier AM1, a resistor $R_A$, a resistor $R_B$, a resistor $R_C$, a capacitor $C_A$, and a capacitor $C_B$. The amplifier AM1 includes an input terminal IN3, the input terminal IN4, and an output terminal (that is, the output terminal OUT of the filter 100). The input terminal IN3 is a positive input terminal. The input terminal IN4 is a negative input terminal. The input terminal IN3 is coupled to the ground GND. The capacitor $C_B$ and the resistor $R_B$ are coupled to the input terminal IN4. The resistor $R_C$ and the capacitor $C_B$ are coupled to the output terminal OUT. The capacitor $C_A$ is coupled between the node N1 and the ground terminal GND. The resistor $R_A$, the resistor $R_B$, the resistor $R_C$, and the capacitor $C_A$ are coupled to the node N1. The resistor $R_A$, the switch S, and the filter circuit 130 are coupled to a node N2.

A product of a resistance value of the resistor $R_B$, a resistance value of the resistor $R_C$, a capacitance value of the capacitor $C_A$, and a capacitance value of the capacitor $C_B$ affects a cutoff frequency of the filter circuit 120. For example, when the product of the resistance value of the resistor $R_B$, the resistance value of the resistor $R_C$, the capacitance value of the capacitor $C_A$, and the capacitance value of the capacitor $C_B$ is greater, the cutoff frequency of the filter circuit 120 is lower.

The filter circuit 130 includes a capacitor $C_i$ and a resistor $R_L$. The capacitor $C_i$ and the switch S are coupled in parallel between the input terminal IN and the node N2. The resistor $R_L$ is coupled between the input terminal IN and the ground terminal GND. In some embodiments, the capacitor $C_i$ and the switch S are coupled in parallel between the input terminal IN and the node N2, and the resistor $R_L$ is coupled between the node N2 and the ground GND.

A capacitance value of the capacitor $C_i$ affects a cutoff frequency of the filter circuit 130. For example, when the capacitance value of the capacitor $C_i$ is greater, the cutoff frequency of the filter circuit 130 is lower.

In some embodiments, a resistance value of the resistor $R_A$ is substantially in a range of 100-1000 ohm. The resistance value of the resistor $R_B$ is substantially equal to 1000 ohm. The resistance value of the resistor $R_C$ is substantially equal to 2000 ohm. A resistance value of the resistor $R_L$ in a range of 50-15000 ohm. The capacitance value of the capacitor $C_A$ is substantially equal to 3 pF. The capacitance value of the capacitor $C_B$ is substantially equal to 0.5 pF. The capacitance value of the capacitor Ci is substantially equal to 40 pF. However, the present disclosure is not limited to the values above. Various values are within scopes of the present disclosure.

Figure 2:
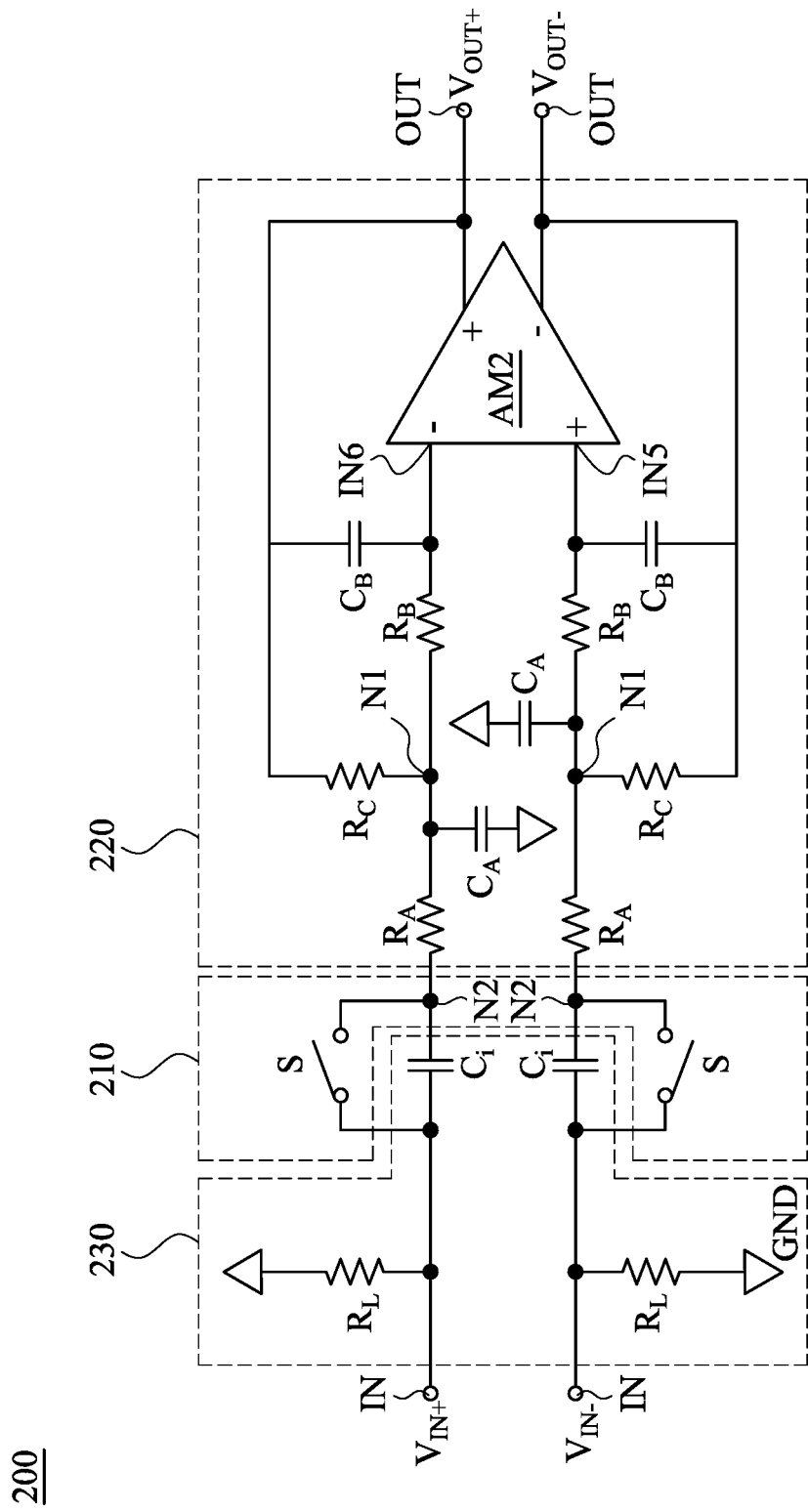
FIG. 2 is a circuit diagram illustrating a filter according to some embodiments of the present disclosure.

Reference is made to FIG. 2. FIG. 2 is a circuit diagram illustrating a filter 200 according to some embodiments of the present disclosure. In this embodiment, input signals received by two input terminals of the filter 200 are a pair of differential input signals (for example, differential input signals $V_{IN+}$ and $V_{IN-}$). The filter 200 is configured to perform a filtering process on the differential input signals to filter signals in unwanted frequency bands, such that a pair of differential output signals $V_{OUT+}$ and $V_{OUT-}$ are generated. For ease of understanding, with respect to FIG. 1, like elements in FIG. 2 are designated with the same reference numbers.

As illustrated in FIG. 2, the filter 200 includes a switching circuit 210, a filter circuit 220, and a filter circuit 230. The filter circuit 220 is a low pass filter circuit. The filter circuit 230 is a high pass filter circuit. The switching circuit 210 includes two switches S. The switches S are coupled between the filter circuit 220 and the filter circuit 230. The filter circuit 230 includes two capacitors $C_i$ and two resistors $R_L$. Effectively, the switching circuit 210 in FIG. 2 includes two sets of the switching circuits 110 in FIG. 1, and the filter circuit 230 in FIG. 2 includes two sets of the filter circuit 130 in FIG. 1. Elements and connections of the switching circuit 210 and the filter circuit 230 in FIG. 2 are similar to those of the switching circuit 110 and the filter circuit 130 in FIG. 1 respectively, so they are not described herein again. In some embodiments, the capacitors $C_i$ and the switches S are coupled in parallel between the input terminals IN and the nodes N2, and the resistors $R_L$ is coupled between the nodes N2 and the ground terminal GND.

The filter circuit 220 includes an amplifier AM2, two resistors $R_A$, two resistors $R_B$, two resistors $R_C$, two capacitors $C_A$, and two capacitors $C_B$. Effectively, the filter circuit 220 in FIG. 2 includes two sets of the filter circuit 120 in FIG. 1 but only one amplifier AM2. The amplifier AM2 includes an input terminal IN5, an input terminal IN6, and two output terminals. The input terminal IN5 is a positive input terminal. The input terminal IN6 is a negative input terminal. The two output terminals of the amplifier AM2 are two output terminals of the filter 100. One of the resistors $R_B$ and one of the capacitors $C_B$ are coupled at the input terminal IN5. Another one of the resistors $R_B$ and another one of the capacitors $C_B$ are coupled at the input terminal IN6. Elements and connections of the filter circuit 220 in FIG. 2 are similar to those of the filter circuit 120 in FIG. 1, so they are not described herein again.

As described above, when the switches S of the switching circuit 210 are turned on, the filter circuit 220 performs a low pass filtering process on the differential input signals $V_{IN+}$ and $V_{IN-}$. When the switches S of the switching circuit 210 are turned off, the filter circuit 220 works in coordinate with the filter circuit 230 to perform a band pass filtering process on the differential input signals $V_{IN+}$ and $V_{IN-}$.

Figure 3:
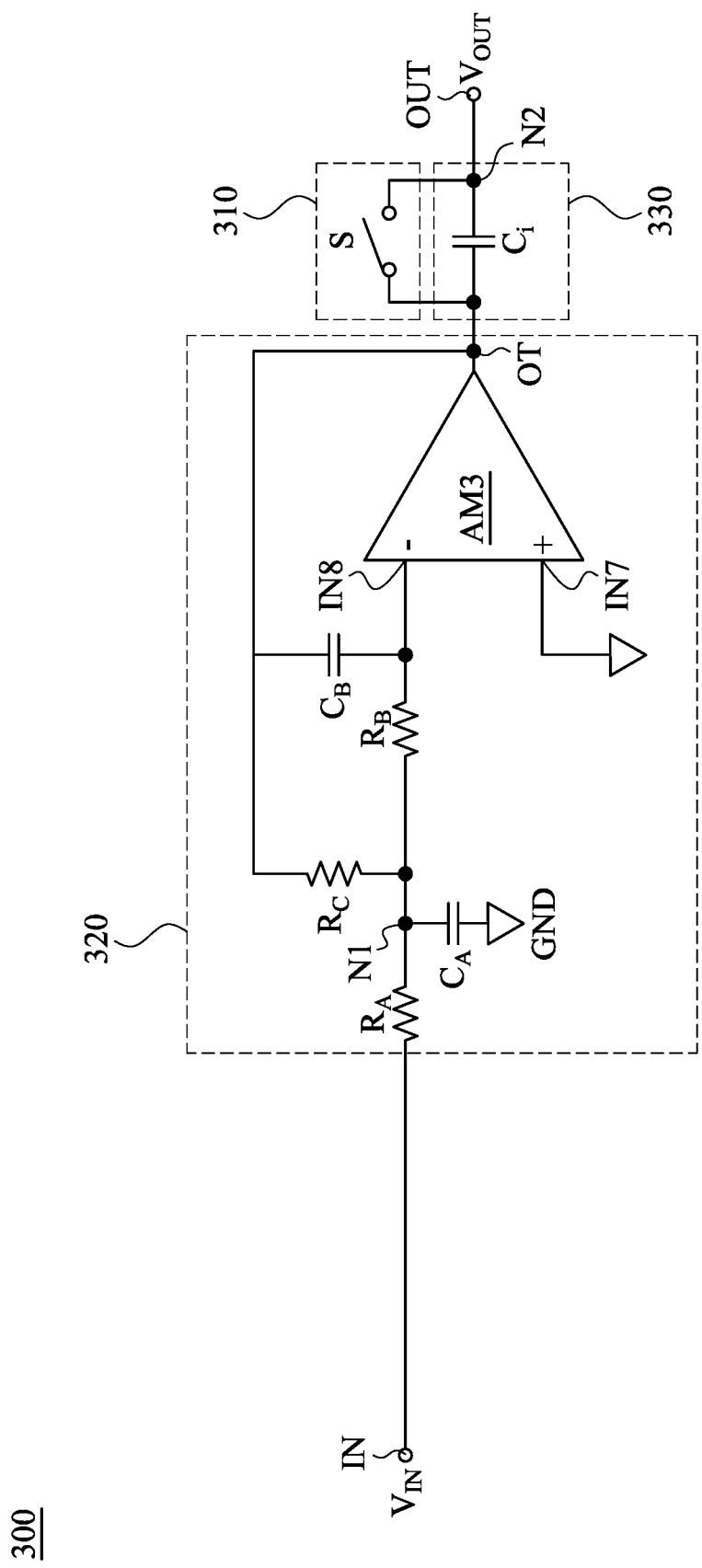
FIG. 3 is a circuit diagram illustrating a filter according to some embodiments of the present disclosure.

Reference is now made to FIG. 3. FIG. 3 is a circuit diagram illustrating a filter 300 according to some embodiments of the present disclosure. As illustrated in FIG. 3, the filter 300 includes a switching circuit 310, a filter circuit 320, and a filter circuit 330. The switching circuit 310 in FIG. 3 is similar to the switching circuit 110 in FIG. 1. The filter circuit 320 in FIG. 3 is similar to the filter circuit 120 in FIG.

1. The filter circuit 330 in FIG. 3 is similar to the filter circuit 130 in FIG. 1. The differences between FIG. 3 and FIG. 1 are that the input terminal IN of the filter 300 is coupled to the output terminal OUT of the filter 300 sequentially through the filter circuit 320 and the filter circuit 330. The filter circuit 320 is a low pass filter circuit. The filter circuit 330 is a high pass filter circuit. Alternatively stated, in FIG. 3, compared to the filter circuit 330, the filter circuit 320 (low pass filter circuit) is closer to the input terminal IN.

To be more specific, the switching circuit 310 includes a switch S. The filter circuit 320 includes an amplifier AM3, a resistor $R_A$, a resistor $R_B$, a resistor $R_C$, a capacitor $C_A$, and a capacitor $C_B$. The amplifier AM3 includes an input terminal IN7, an input terminal IN8, and an output terminal OT. The input terminal IN7 is a positive terminal. The input terminal IN8 is a negative input terminal. The input terminal IN7 is coupled to the ground terminal GND. The capacitor $C_B$ and the resistor $R_B$ are coupled to the input terminal IN8. The resistor $R_C$ and the capacitor $C_B$ are coupled to the output terminal OT of the amplifier AM3. The capacitor $C_A$ is coupled between the node N1 and the ground terminal GND. The resistor $R_A$, the resistor $R_B$, the resistor $R_C$, and the capacitor $C_A$ are coupled to a node N1. The resistor $R_A$ is coupled between the input terminal IN and the node N1. The filter circuit 330 includes the capacitor $C_i$. The capacitor $C_i$ and the switch S are coupled in parallel between the output terminal OT of the amplifier AM3 and the output terminal OUT of the filter 300.

When the switch S of the switching circuit 310 is turned on, the filter circuit 320 performs a low pass filtering process on the input signal $V_{IN}$. When the switch S of the switching circuit 310 is turned off, the filter circuit 320 and the filter circuit 330 performs a low pass filtering process and a high pass filtering process on the input signal $V_{IN}$ sequentially. Effectively, the filter circuit 320 works with coordination with the filter circuit 330 to perform a band pass filtering process.

References are made to FIG. 4A to FIG. 4H. FIG. 4A to FIG. 4H are circuit diagrams illustrating low pass filters according to some embodiments of the present disclosure. In some other embodiments, the filter circuit 120 in FIG. 1 or the filter circuit 320 in FIG. 3 may be implemented by one of low pass filters 420-1 to 420-8 in FIG. 4A to FIG. 4H.

Figure 4B:
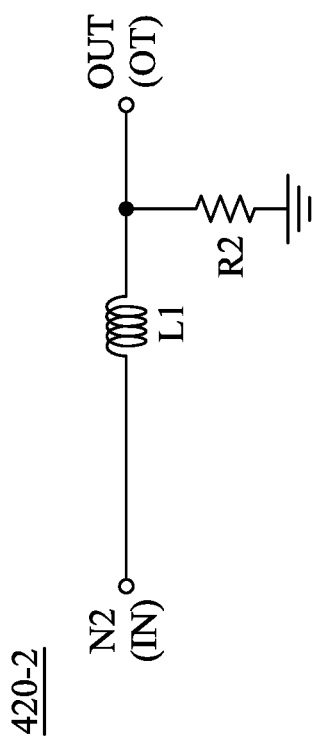
FIG. 4A to FIG. 4H are circuit diagrams illustrating low pass filters according to some embodiments of the present disclosure.
Figure 4D:
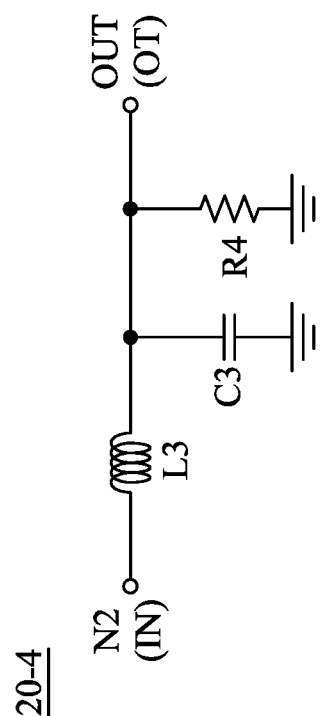
Figure 4A:
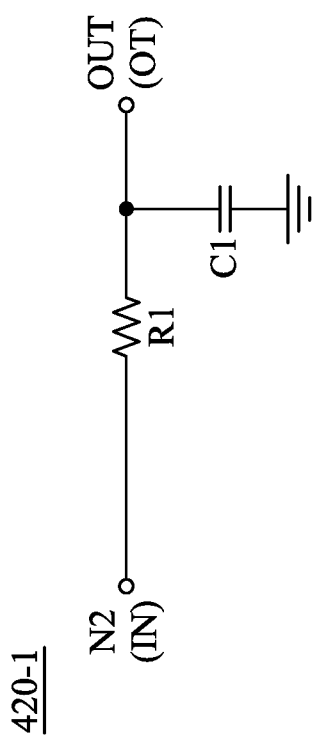
Figure 4C:
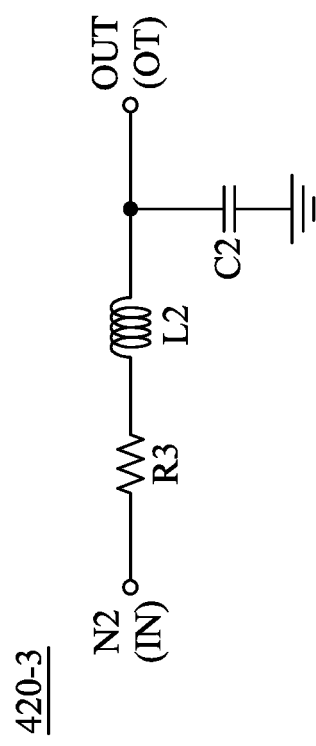
Figure 4F:
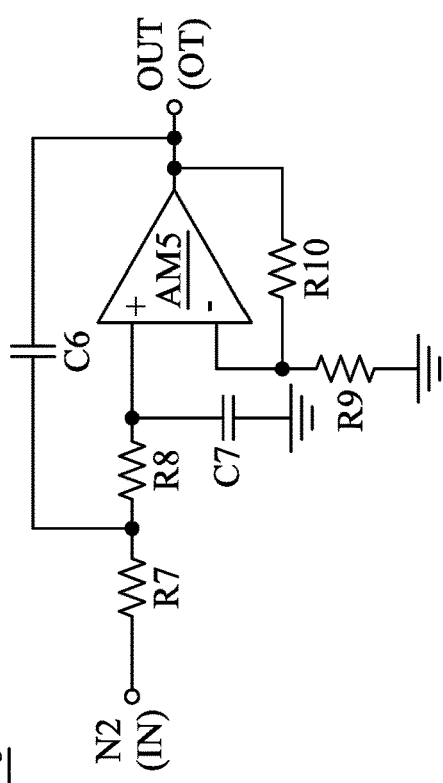
Figure 4H:
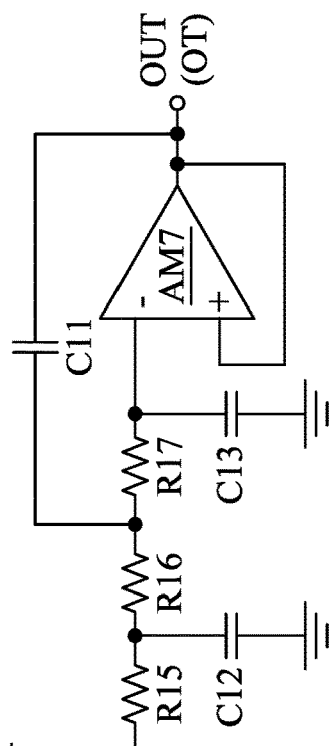
Figure 4E:
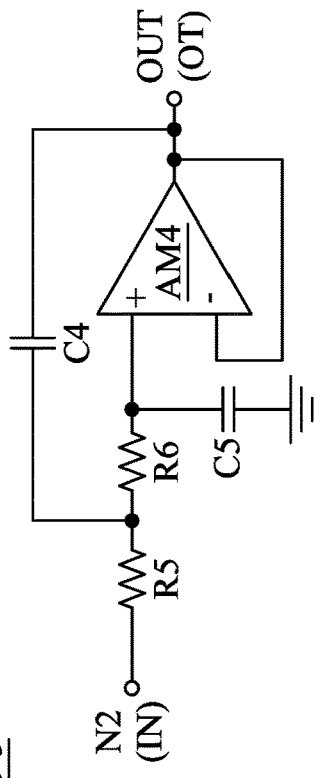
Figure 4G:
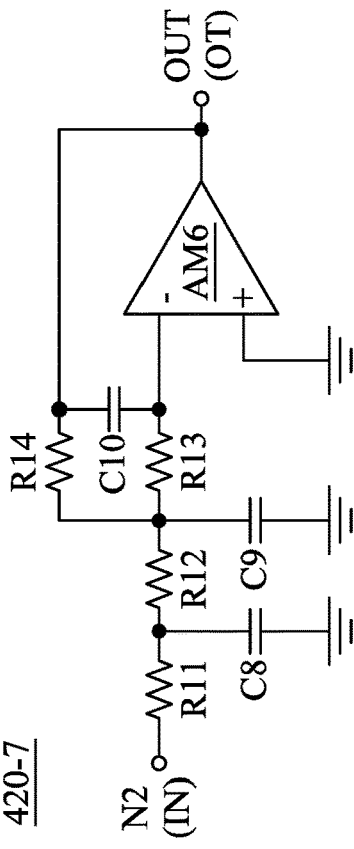

To be more specific, the filter circuit 420-1 in FIG. 4A includes a resistor R1 and a capacitor C1. The filter circuit 420-2 in FIG. 4B includes an inductor L1 and a resistor R2. The filter circuit 420-3 in FIG. 4C includes a resistor R3, an inductor L2, and a capacitor C2. The filter circuit 420-4 in FIG. 4D includes an inductor L3, a capacitor C3, and a resistor R4. The filter circuit 420-5 in FIG. 4E includes a resistor R5, a resistor R6, a capacitor C4, a capacitor C5, and an amplifier AM4. The filter circuit 420-6 in FIG. 4F includes a resistor R7, a resistor R8, a resistor R9, a resistor R10, a capacitor C6, a capacitor C7, and an amplifier AM5. The filter circuit 420-7 in FIG. 4G includes a resistor R11, a resistor R12, a resistor R13, a resistor R14, a capacitor C8, a capacitor C9, a capacitor C10, and an amplifier AM6. The filter circuit 420-8 in FIG. 4H includes a resistor R15, a resistor R16, a resistor R17, a capacitor C11, a capacitor C12, a capacitor C13, and an amplifier AM7.

References are made to FIG. 5A to FIG. 5G. FIG. 5A to FIG. 5G are circuit diagrams illustrating high pass filters according to some embodiments of the present disclosure. In some other embodiments, the filter circuit 130 in FIG. 1 or the filter circuit 330 in FIG. 3 may be implemented by one of high pass filters 530-1 to 530-7 in FIG. 5A to FIG. 5G.

Figure 5B:
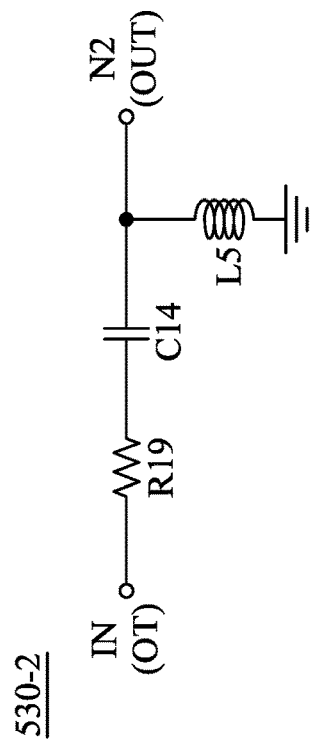
FIG. 5A to FIG. 5G are circuit diagrams illustrating high pass filters according to some embodiments of the present disclosure.
Figure 5D:
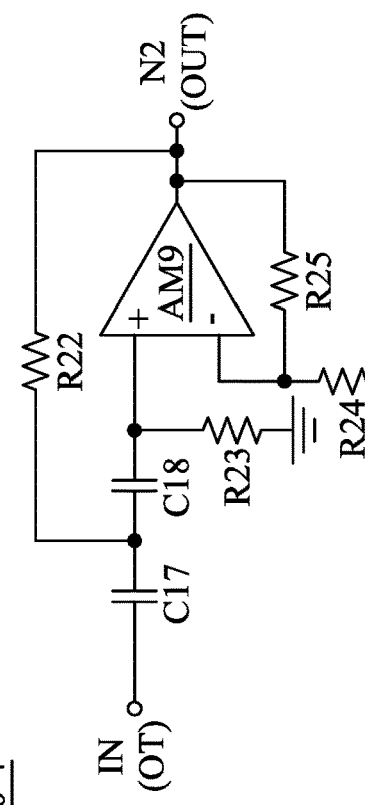
Figure 5A:
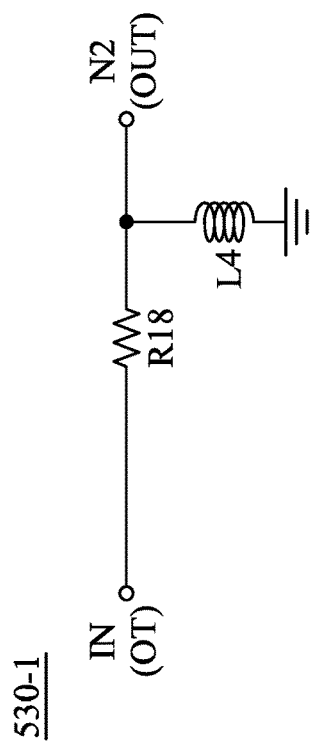
Figure 5C:
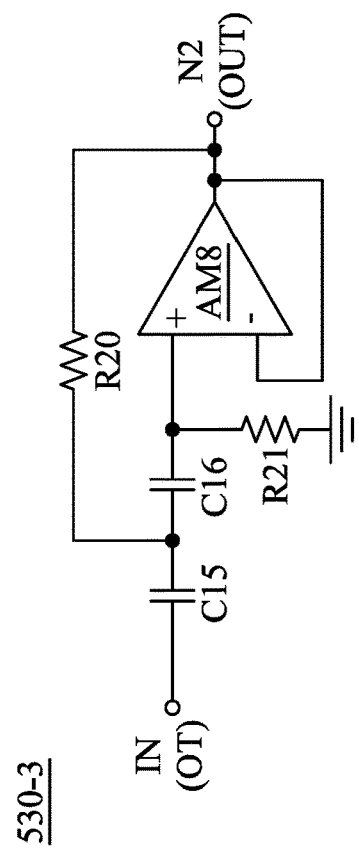
Figure 5E:
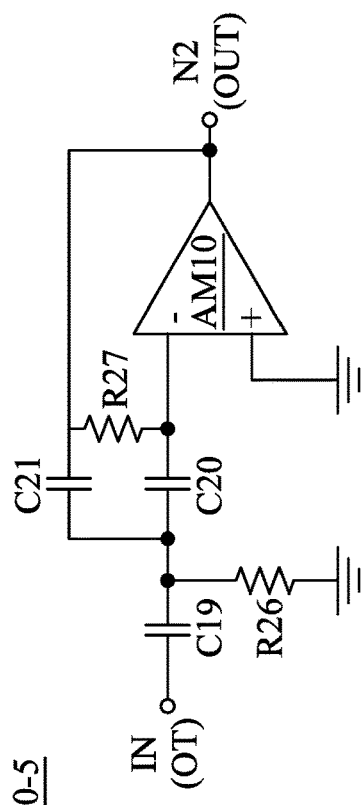
Figure 5F:
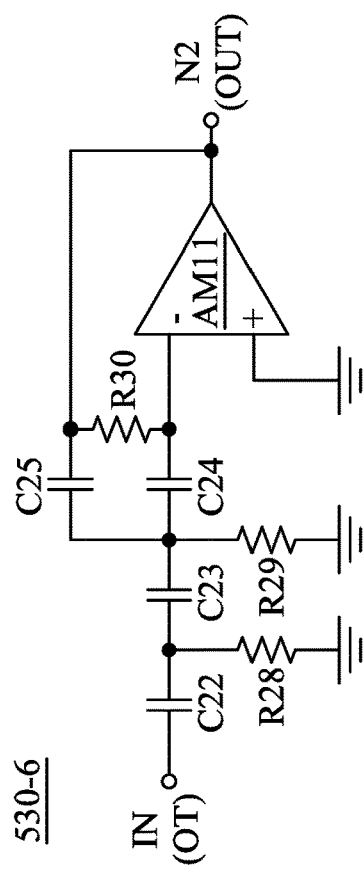
Figure 5G:
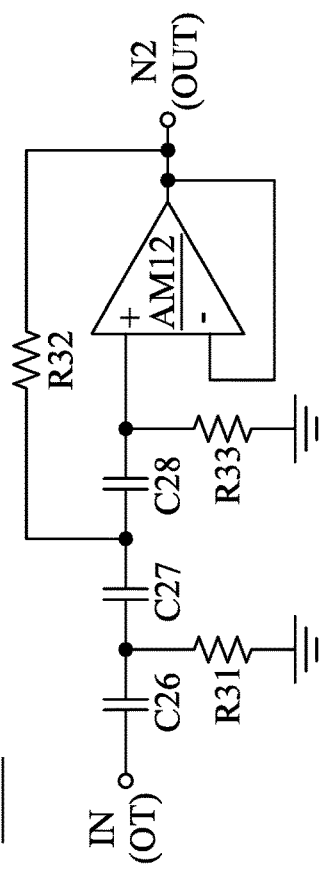

To be more specific, the filter circuit 530-1 in FIG. 5A includes a resistor R18 and an inductor L4. The filter circuit 530-2 in FIG. 5B includes a resistor R19, a capacitor C14, and an inductor L5. The filter circuit 530-3 in FIG. 5C includes a resistor R20, a resistor R21, a capacitor C15, a capacitor C16, and an amplifier AM8. The filter circuit 530-4 in FIG. 5D includes a resistor R22, a resistor R23, a resistor R24, a resistor R25, a capacitor C17, a capacitor C18, and an amplifier AM9. The filter circuit 530-5 in FIG. 5E includes a resistor R26, a resistor R27, a capacitor C19, a capacitor C20, a capacitor C21, and an amplifier AM10. The filter circuit 530-6 in FIG. 5F includes a resistor R28, a resistor R29, a resistor R30, a capacitor C22, a capacitor C23, a capacitor C24, a capacitor C25, and an amplifier AM11. The filter circuit 530-7 in FIG. 5G includes a resistor R31, a resistor R32, a resistor R33, a capacitor C26, a capacitor C27, a capacitor C28, and an amplifier AM12.

Figure 6:
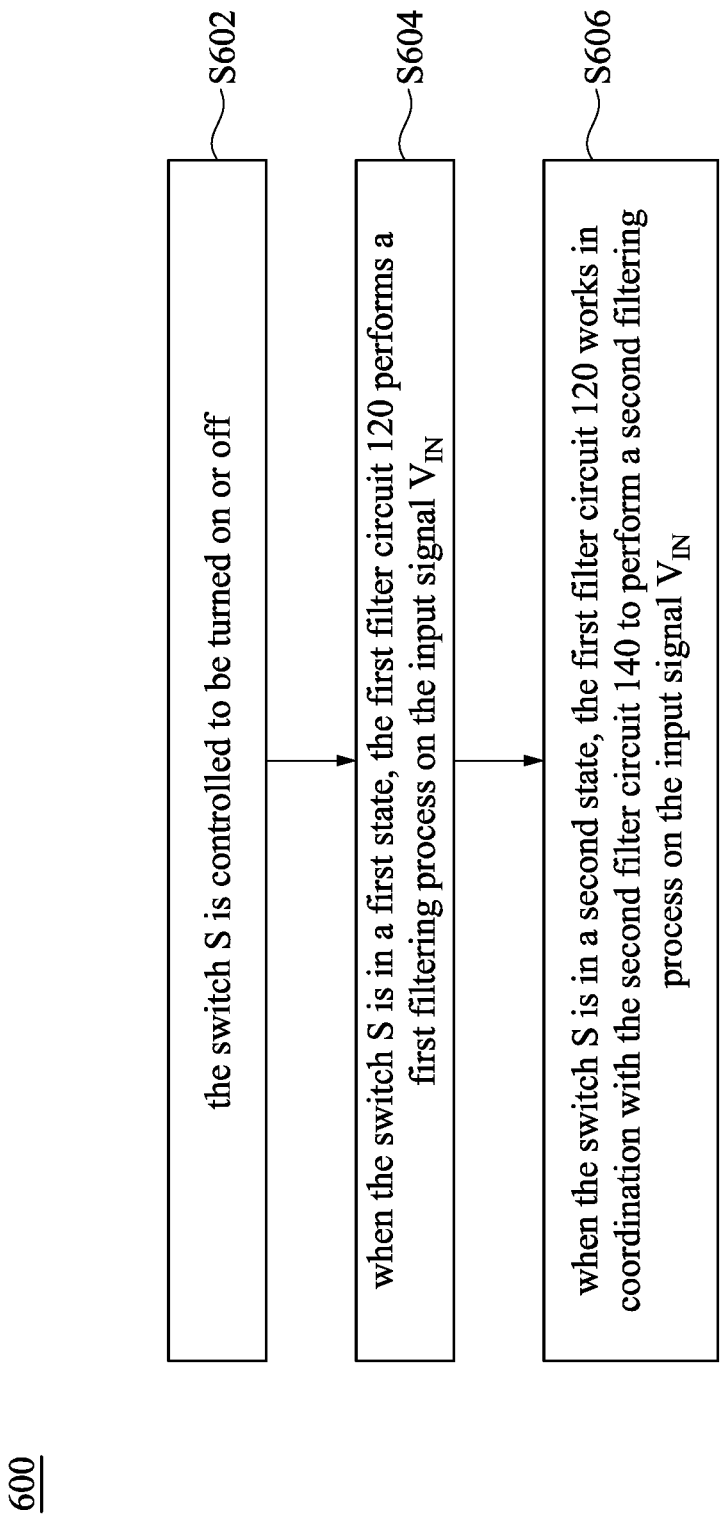
FIG. 6 is a flow diagram illustrating an operation method of a filter according to some embodiments of the present disclosure.

Reference is made to FIG. 6. FIG. 6 is a flow diagram illustrating an operation method 600 of a filter according to some embodiments of the present disclosure. The operation method 600 includes steps S602, S604, and S606. In some embodiments, the operation method 600 is applied to the filter 100 in FIG. 1, the filter 200 in FIG. 2, or the filter 300 in FIG. 3, but the present disclosure is not limited thereto. For ease of understanding, the operation method 600 is discussed with FIG. 1 (or FIG. 3).

In step S602, the switch S is controlled to be turned on or off. In some embodiments, the switch S is implemented by a transistor. A voltage level of a control signal configured to control the switch S to be turned on or off may be designed according to a type of the transistor.

In step S604, when the switch S is turned on (turned-on state), the filter circuit 120 performs a low pass filtering process on the input signal $V_{IN}$. In some embodiments, as illustrated in FIG. 3, the filter circuit 320 performs a low pass filtering process on the input signal $V_{IN}$.

In step S606, when the switch S is turned off (turned-off state), the filter circuit 120 works in coordination with the filter circuit 130 to perform a band pass filtering process on the input signal $V_{IN}$. In specific, the filter circuit 130 and the filter circuit 120 sequentially perform a high pass filtering process and a low pass filtering process on the input signal $V_{IN}$. In some embodiments, as illustrated in FIG. 3, the filter circuit 320 and the filter circuit 330 sequentially perform a low pass filtering process and a high pass filtering process on the input signal $V_{IN}$. Effectively, the filter circuit 120 (320) works in coordination with the filter circuit 130 (330) to perform a band pass filtering process.

As shown in the above embodiments, the filter of the present disclosure can perform different filtering processes.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry.

Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A filter comprising:
    a switching circuit;
    a first filter circuit coupled to the switching circuit; and
    a second filter circuit coupled to the switching circuit, wherein the switching circuit is controlled to control the first filter circuit perform a first filtering process on an input signal, or control the first filter circuit to work in coordination with the second filter circuit to perform a second filtering process on the input signal,
    wherein the first filter circuit comprises:
        an amplifier;
        a first resistor;
        a first capacitor, wherein the first capacitor and the first resistor are coupled to a first input terminal of the amplifier;
        a second resistor, wherein the second resistor and the first capacitor are coupled to a first output terminal of the amplifier;
        a second capacitor coupled between a first node and a ground terminal; and
        a third resistor, wherein the third resistor, the first resistor, the second resistor, and the second capacitor are coupled to the first node, wherein the third resistor, the switching circuit, and the second filter circuit are coupled to a second node.

2. The filter of claim 1, wherein the first filter circuit is a low pass filter, and the second filter circuit is a high pass filter.

3. The filter of claim 2, wherein the first filtering process is a low pass filtering process, and the second filtering process is a band pass filtering process.

4. The filter of claim 1, wherein an input terminal of the filter is coupled to an output terminal of the filter sequentially through the second filter circuit and the first filter circuit, wherein the input terminal of the filter is configured to receive the input signal.

5. The filter of claim 4, wherein the switching circuit comprises a first switch and the second filter circuit comprises:
    a third capacitor, wherein the third capacitor and the first switch are coupled between the input terminal of the filter and the second node; and
    a fourth resistor coupled between the input terminal of the filter and the ground terminal.

6. The filter of claim 1, wherein the input signal comprises a pair of differential input signals, and the filter is configured to output a pair of differential output signal according to the pair of differential input signals.

7. The filter of claim 6, wherein the switching circuit comprises:
    two first switches coupled between the first filter circuit and the second filter circuit.

8. The filter of claim 7, wherein the first filter circuit further comprises:
    a fourth resistor;
    a third capacitor, wherein the third capacitor and the fourth resistor are coupled to a second input terminal of the amplifier;
    a fifth resistor, wherein the fifth resistor and the third capacitor are coupled to a second output terminal of the amplifier;
    a fourth capacitor coupled between a third node and the ground terminal; and
    a sixth resistor, wherein the sixth resistor, the fourth resistor, the fifth resistor, and the fourth capacitor are coupled to the third node, wherein the sixth resistor, the switching circuit, and the second filter circuit are coupled to a fourth node.

9. The filter of claim 8, wherein the second filter circuit comprises:
    two fifth capacitors, wherein one of the fifth capacitors and one of the first switches are coupled in parallel between a first input terminal of the filter and the second node, wherein the other one of the fifth capacitors and the other one of the first switches are coupled in parallel between a second input terminal of the filter and the fourth node; and
    two seventh resistors, wherein one of the seventh resistors is coupled between the first input terminal of the filter and the ground terminal, wherein the other one of the seventh resistors is coupled between the second input terminal of the filter and the ground terminal.

10. A filter comprising:
    a switching circuit;
    a first filter circuit coupled to the switching circuit; and
    a second filter circuit coupled to the switching circuit, wherein the switching circuit is controlled to control the first filter circuit perform a first filtering process on an input signal, or control the first filter circuit to work in coordination with the second filter circuit to perform a second filtering process on the input signal,
    wherein the first filter circuit is a low pass filter, and the second filter circuit is a high pass filter, an output terminal of the low pass filter is coupled to an input terminal of the high pass filter, and the switching circuit and the high pass filter are coupled in parallel between the output terminal of the low pass filter and an out terminal of the filter.

11. The filter of claim 10, wherein the first filter circuit comprises:
    an amplifier, wherein a first input terminal of the amplifier is coupled to a ground terminal;
    a first resistor;
    a first capacitor, wherein the first capacitor and the first resistor are coupled to a second input terminal of the amplifier;
    a second resistor, wherein the second resistor and the first capacitor are coupled to an output terminal of the amplifier;
    a second capacitor coupled between a node and the ground terminal; and
    a third resistor coupled between the input terminal and the node.

12. The filter of claim 11, wherein the switching circuit comprises a first switch and the second filter circuit comprises:

a third capacitor, wherein the third capacitor and the first switch are couple between the output terminal of the amplifier and an output terminal of the filter.

13. An operation method comprising:

controlling a switching circuit to be turned on or off;

performing a first filtering process on an input signal by a first filter circuit of a filter when the switching circuit is in a first state; and performing a second filtering process on the input signal by the first filter circuit and a second filter circuit of the filter when the switching circuit is in a second state, wherein the input signal comprises a pair of differential input signals, and the filter is configured to output a pair of differential output signal according to the pair of differential input signals.

14. The operation method of claim 13, wherein when the switching circuit is in a turned-on state, the first filter circuit perform the first filtering process on the input signal, wherein when the switching circuit is in a turned-off state, the first filter circuit works in coordination with the second filter circuit to perform a second filtering process on the input signal.

15. The operation method of claim 14, wherein the first filtering process is a low pass filtering process, and the second filtering process is a band pass filtering process.

16. The operation method of claim 14, wherein the first filter circuit is a low pass filter, and the second filter circuit is a high pass filter.

17. The operation method of claim 13, wherein the switching circuit comprises:

two first switches coupled between the first filter circuit and the second filter circuit.

18. The operation method of claim 17, wherein the first filter circuit comprises:

an amplifier comprising two input terminals and two output terminals;

two first resistors;

two first capacitors, wherein the first capacitors and the first resistors are coupled to the input terminals of the amplifier respectively;

two second resistors, wherein the second resistors and the first capacitors are coupled to the output terminals of the amplifier respectively, wherein the output terminals of the amplifier are output terminals of the filter;

two second capacitors coupled between two first nodes and a ground terminal respectively; and two third resistors, wherein the third resistors, the first resistors, the second resistors, and the second capacitors are coupled to the first nodes respectively, wherein the third resistors, the first switches, and the second filter circuit are coupled to two second nodes respectively.

19. The operation method of claim 18, wherein the second filter circuit comprises:

two third capacitors, wherein the third capacitors and the first switches coupled in parallel between two input terminals of the filter and the second nodes respectively; and two fourth resistors coupled between the input terminals and the ground terminal respectively.

* * * * *